United States Patent
Ohmi et al.

(10) Patent No.: US 6,609,446 B1
(45) Date of Patent: Aug. 26, 2003

(54) SEPARATING APPARATUS, SEPARATING METHOD, AND METHOD OF MANUFACTURING SEMICONDUCTOR SUBSTRATE

(75) Inventors: Kazuaki Ohmi, Yokohama (JP); Takao Yonehara, Atsugi (JP); Kiyofumi Sakaguchi, Yokohama (JP); Kazutaka Yanagita, Yokohama (JP); Hirokazu Kurisu, Nagoya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/495,847

(22) Filed: Feb. 1, 2000

(30) Foreign Application Priority Data

Feb. 2, 1999 (JP) .......................... 11-025482

(51) Int. Cl.$^7$ ............................. B23B 27/10; B23B 5/14
(52) U.S. Cl. ..................... 82/46; 82/50; 82/47
(58) Field of Search ............... 82/46, 1.11, 47, 82/50, 173; 156/344, 584; 29/426.5, 239, 426.3

(56) References Cited

U.S. PATENT DOCUMENTS

| | | | |
|---|---|---|---|
| 3,969,813 A | * 7/1976 | Minetti et al. | ................ 29/829 |
| 4,466,852 A | * 8/1984 | Beltz et al. | ................ 156/344 |
| 5,363,556 A | * 11/1994 | Banholzer et al. | ..... 29/890.142 |
| 5,783,022 A | 7/1998 | Cha et al. | |
| 6,077,383 A | * 6/2000 | Laporte | ...................... 156/344 |
| 6,102,529 A | * 8/2000 | Okazaki et al. | ............... 347/65 |

FOREIGN PATENT DOCUMENTS

| | | |
|---|---|---|
| EP | 0867917 A2 | 9/1998 |
| JP | 5-21338 | 1/1993 |
| JP | 7-302889 | 11/1995 |
| JP | 11-45840 | 2/1999 |

OTHER PUBLICATIONS

"History of Water Jet Machining Development", *Journal of Water Jet Technology*, Society of Japan, vol. 1, Jan. 1, 1984.

* cited by examiner

*Primary Examiner*—Henry Tsai
(74) *Attorney, Agent, or Firm*—Morgan & Finnegan, LLP

(57) ABSTRACT

When a bonded substrate stack prepared by bonding a first substrate in which a single-crystal Si layer is formed on a porous layer, and an insulating layer is formed on the single-crystal Si layer to a second substrate is to be separated at the porous layer, serrate defects at the peripheral portion of the separated substrates are prevented. A fluid is ejected from an ejection nozzle (112) and injected into the porous layer of a bonded substrate stack (30) while rotating the bonded substrate stack (30) about an axis (C) in a direction (R), thereby separating the bonded substrate stack (30) into two substrates at the porous layer. When the peripheral portion of the bonded substrate stack (30) is to be separated, the ejection nozzle (112) is located within a range (B).

17 Claims, 12 Drawing Sheets

FIG. 5
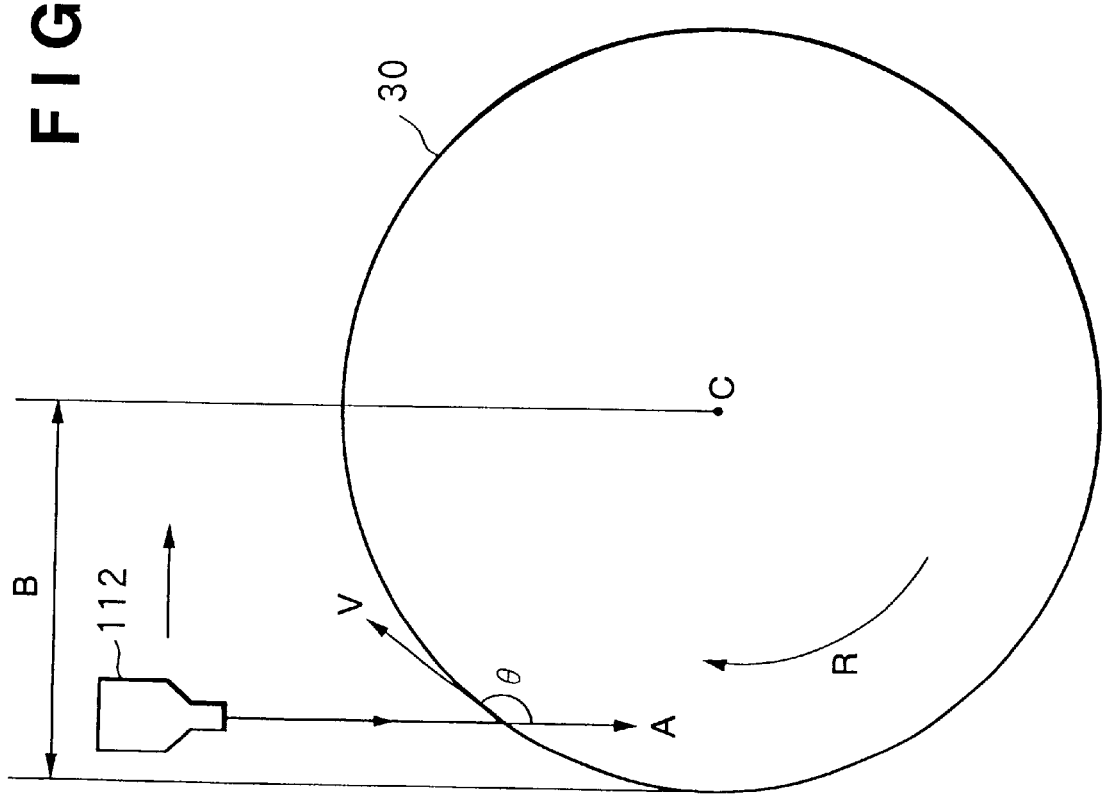
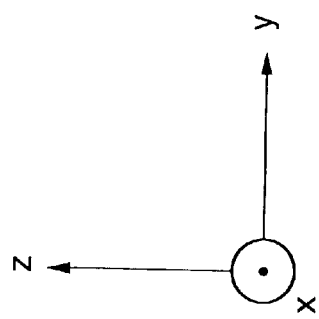

FIG. 9
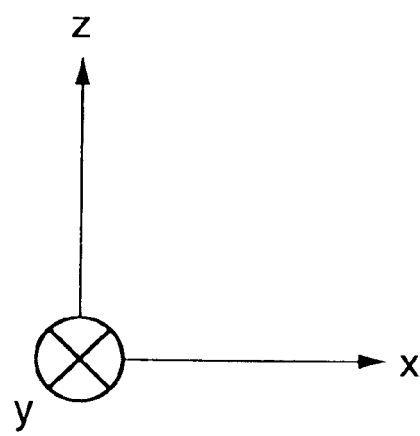
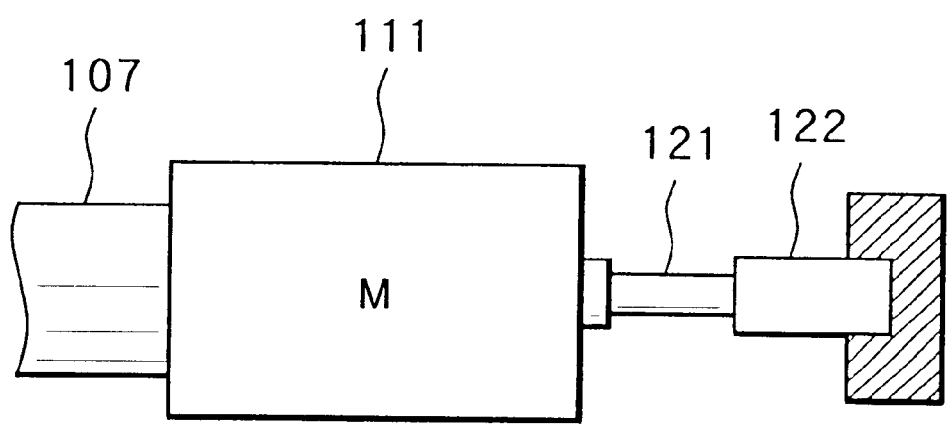

SEPARATING APPARATUS, SEPARATING METHOD, AND METHOD OF MANUFACTURING SEMICONDUCTOR SUBSTRATE

BACKGROUND OF THE INVENTION

1. Field of the Invention

The present invention relates to a member separating apparatus and method and a method of manufacturing a semiconductor substrate.

2. Description of the Related Art

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A complete depletion type field effect transistor can be formed by thin film formation.

Since an SOI structure has the above various advantages, researches have been made on its formation method for several decades.

As one SOI technology, the SOS (Silicon On Sapphire) technology by which Si is heteroepitaxially grown on a single-crystal sapphire substrate by CVD (Chemical Vapor Deposition) has been known for a long time. This SOS technology once earned a reputation as the most matured SOI technology. However, the SOS technology has not been put into practical use to date because, e.g., a large amount of crystal defects are produced by lattice mismatch in the interface between the Si layer and the underlying sapphire substrate, aluminum that forms the sapphire substrate mixes in the Si layer, the substrate is expensive, and it is difficult to obtain a large area.

An SOI technology using a buried oxide layer has appeared next to the SOS technology. For this SOI technology, various methods have been examined to reduce crystal defects or manufacturing cost. The methods include a SIMOX (Separation by Ion iMplanted OXygen) method of ion-implanting oxygen into a substrate to form a buried oxide layer, a method of bonding two wafers via an oxide film and polishing or etching one wafer to leave a thin single-crystal Si layer on the oxide film, and a method of ion-implanting hydrogen to a predetermined depth from the surface of an Si substrate having an oxide film, bonding the substrate to another substrate, leaving a thin single-crystal Si layer on the oxide film by heating or the like, and peeling one (the other substrate) of the bonded substrates.

The present applicant has disclosed a new SOI technology in Japanese Patent Laid-Open No. 5-21338. In this technique, a first substrate obtained by forming a non-porous single-crystal layer (including a single-crystal Si layer) on a single-crystal semiconductor substrate having a porous layer is bonded to a second substrate via an insulating layer ($SiO_2$). After this, the substrates are separated at the porous layer, thereby transferring the non-porous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred Å to 10-μm thick SOI films can be manufactured by a single manufacturing apparatus.

The present applicant has also disclosed, in Japanese Patent Laid-Open No. 7-302889, a technique of bonding first and second substrates, separating the first substrate from the second substrate without breaking the first substrate, smoothing the surface of the separated first substrate, forming a porous layer again on the first substrate, and reusing this substrate. Since the first substrate is not wasted, this technique is advantageous in largely reducing the manufacturing cost and simplifying the manufacturing process.

For example, in the method described in Japanese Patent Laid-Open No. 5-21338, i.e., the method in which a substrate (to be referred to as a bonded substrate stack hereinafter) obtained by bonding a first substrate having a non-porous layer such as a single-crystal Si layer on a porous layer to a second substrate via an insulating layer is separated at the porous layer, thereby transferring the non-porous layer formed on the first substrate side to the second substrate, the technique of separating the bonded substrate stack is very important.

For example, in separating the bonded substrate stack, if it is separated at a portion except the porous layer as the separation layer, the non-porous layer (e.g., a single-crystal Si layer) to be used as an active layer is broken, and no desired SOI substrate can be obtained.

SUMMARY OF THE INVENTION

The present invention has been made in consideration of the above situation, and has as its object to prevent any defects in separating a disk-like member such as a bonded substrate stack.

According to the first aspect of the present invention, there is provided a separating apparatus for separating a disk-like member having a separation layer inside, characterized by comprising a holding mechanism for holding the disk-like member while rotating the disk-like member about an axis perpendicular to the separation layer, and a fluid ejection portion for injecting a stream of fluid into the separation layer of the disk-like member held by the holding portion to separate the disk-like member at the separation layer by the fluid, wherein when separating a peripheral portion of the disk-like member, a rotational direction of the disk-like member, a moving direction of the fluid, and a position of the ejection portion are maintained to satisfy a condition in which the moving direction component of the velocity of the disk-like member at an injection position of the fluid to the disk-like member has a negative value.

In the separating apparatus according to the first aspect of the present invention, for example, when separating the peripheral portion of the disk-like member, the ejection portion preferably ejects the fluid having pressure at which an outermost peripheral portion of the disk-like member is separated from an inside to an outside by the fluid injected into the disk-like member.

The separating apparatus according to the first aspect of the present invention preferably further comprises, e.g., a control section for controlling the pressure of the fluid ejected from the ejection portion.

In the separating apparatus according to the first aspect of the present invention, the control section preferably changes the pressure of the fluid in accordance with, e.g., progress of separation processing.

The separating apparatus according to the first aspect of the present invention preferably further comprises, e.g., a driving mechanism for moving the ejection portion along the separation layer.

In the separating apparatus according to the first aspect of the present invention, for example, when separating the peripheral portion of the disk-like member, the driving mechanism preferably adjusts the position of the ejection portion such that the fluid is injected into the peripheral portion, and when separating a center of the disk-like member, the driving mechanism preferably adjusts the position of the ejection portion such that the fluid is injected into the center.

In the separating apparatus according to the first aspect of the present invention, the separation layer is preferably, e.g., more fragile than remaining portions of the disk-like member.

In the separating apparatus according to the first aspect of the present invention, the separation layer is preferably, e.g., a porous layer.

In the separating apparatus according to the first aspect of the present invention, the separation layer is preferably, e.g., a porous layer having a multilayered structure.

According to the second aspect of the present invention, there is provided a separating apparatus for separating a disk-like member having a separation layer inside, characterized by comprising a holding portion for holding the disk-like member, and a fluid ejection portion for injecting a stream of fluid to the separation layer of the disk-like member held by the holding portion to separate the disk-like member at the separation layer by the fluid, wherein when separating a peripheral portion of the disk-like member, separation processing is executed under a condition in which an outermost peripheral portion of the disk-like member is separated from an inside to an outside of the disk-like member by the fluid injected into the disk-like member.

In the separating apparatus according to the second aspect of the present invention, the holding portion preferably has, e.g., a rotation mechanism for holding the disk-like member while rotating the disk-like member.

According to the third aspect of the present invention, there is provided a separating method of rotating a disk-like member having a separation layer inside about an axis perpendicular to the separation layer and ejecting a stream of fluid from an ejection portion into the separation layer to separate the disk-like member at the separation layer by the fluid, characterized by comprising the peripheral portion separation step of separating a peripheral portion of the disk-like member when a rotational direction of the disk-like member, a moving direction of the fluid, and a position of the ejection portion satisfy a condition in which the moving direction component of the velocity of peripheral portion of the disk-like member at an injection position of the fluid to the disk-like member has a negative value, assuming the moving direction of the fluid in the positive direction.

In the separating method according to the third aspect of the present invention, the peripheral portion separation step preferably comprises, e.g., ejecting, from the ejection portion, the fluid having pressure at which an outermost peripheral portion of the disk-like member is separated from an inside to an outside by the fluid injected into the disk-like member.

The separating method according to the third aspect of the present invention preferably further comprises, e.g., the control step of controlling the pressure of the fluid ejected from the ejection portion.

In the separating method according to the third aspect of the present invention, the separation layer is preferably, e.g., more fragile than remaining portions of the disk-like member.

In the separating method according to the third aspect of the present invention, the separation layer is preferably, e.g., a porous layer.

In the separating method according to the third aspect of the present invention, the separation layer is preferably, e.g., a porous layer having a multilayered structure.

According to the fourth aspect of the present invention, there is provided a separating method of holding a disk-like member having a separation layer inside, ejecting a stream of fluid from an ejection portion, and injecting the fluid into the separation layer to separate the disk-like member at the separation layer by the fluid, characterized by comprising the peripheral portion separation step of separating a peripheral portion of the disk-like member under a condition in which an outermost peripheral portion of the disk-like member is separated from an inside to an outside of the disk-like member by the fluid injected into the disk-like member.

In the separating method according to the fourth aspect of the present invention, the peripheral portion separation step preferably comprises, e.g., executing separation processing while rotating the disk-like member bout an axis perpendicular to the separation layer.

According to the fifth aspect of the present invention, there is provided a method of manufacturing a semiconductor substrate, characterized by comprising the step of preparing a first substrate having a porous layer inside and a non-porous layer on the porous layer, the step of bonding the first substrate and a second substrate via the non-porous layer to form a bonded substrate stack, and the separation step of separating the bonded substrate stack into two substrates at the porous layer while rotating the bonded substrate stack about an axis perpendicular to the porous layer and ejecting a stream of fluid and injecting the fluid into the porous layer, wherein the separation step comprises the peripheral portion separation step of separating a peripheral portion of the bonded substrate stack when a rotational direction of the bonded substrate stack, a moving direction of the fluid, and a position of the ejection portion satisfy a condition in which the moving direction component of the velocity of the bonded substrate stack at an injection position of the fluid to the bonded substrate stack has a negative value.

According to the sixth aspect of the present invention, there is provided a method of manufacturing a semiconductor substrate, characterized by comprising the step of preparing a first substrate having a porous layer inside and a non-porous layer on the porous layer, the step of bonding the first substrate and a second substrate via the non-porous layer to form a bonded substrate stack, and the separation step of separating the bonded substrate stack into two substrates at the porous layer while ejecting a stream of fluid and injecting the fluid into the porous layer, wherein the separation step comprises the peripheral portion separation step of separating a peripheral portion of the bonded substrate stack under a condition in which an outermost peripheral portion of the bonded substrate stack is separated from an inside to an outside of the bonded substrate stack by the fluid injected into the bonded substrate stack.

Further objects, features and advantages of the present invention will become apparent from the following detailed description of the embodiments of the present invention with reference to the accompanying drawings.

BRIEF DESCRIPTION OF THE DRAWINGS

FIG. 5 is a view for explaining the relationship between the rotational direction of a bonded substrate stack (rotating direction of bonded wafer pair), the fluid ejection direction, and the first operation position (position of the ejection nozzle), which is suitable for separation of the peripheral portion of the bonded substrate stack;

FIG. 9 is a view showing the first arrangement of an adjustment mechanism for adjusting the interval between substrate holding portions;

DETAILED DESCRIPTION OF THE PREFERRED EMBODIMENT

A preferred embodiment of the present invention will be described below with reference to the accompanying drawings.

FIGS. 1A to 1E are sectional views for explaining steps in manufacturing an SOI substrate according to the preferred embodiment of the present invention.

Figure 1A:
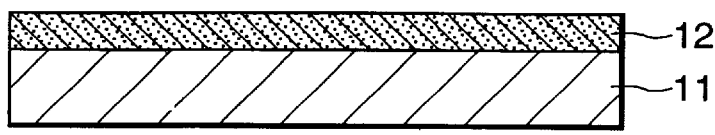
FIGS. 1A to 1E are sectional views for explaining the steps in manufacturing an SOI substrate according to a preferred embodiment of the present invention.

In the step shown in FIG. 1A, a single-crystal Si substrate 11 is prepared, and a porous Si layer 12 is formed on the surface of the single-crystal Si substrate 11 by, e.g., anodizing. The porous Si layer 12 may have a multilayered structure having a plurality of layers with different porosities.

Figure 1B:
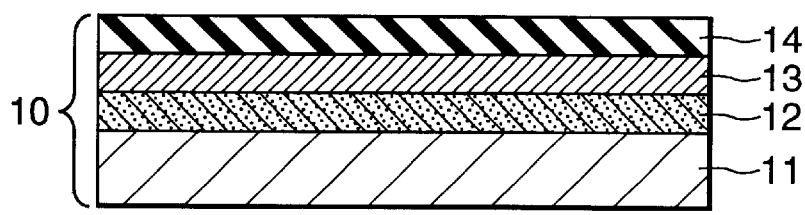

In the step shown in FIG. 1B, a single-crystal Si layer 13 as a non-porous layer is formed on the porous Si layer 12 by epitaxial growth. The surface of the single-crystal Si layer 13 is oxidized to form an $SiO_2$ layer 14 as a non-porous insulating layer. With this process, a first substrate 10 is formed. The porous Si layer 12 may be formed by, e.g., a method of implanting ions into the single-crystal Si substrate 11 (ion implantation). The porous Si layer formed by this method has a number of microcavities and is therefore called a microcavity layer.

Figure 1C:
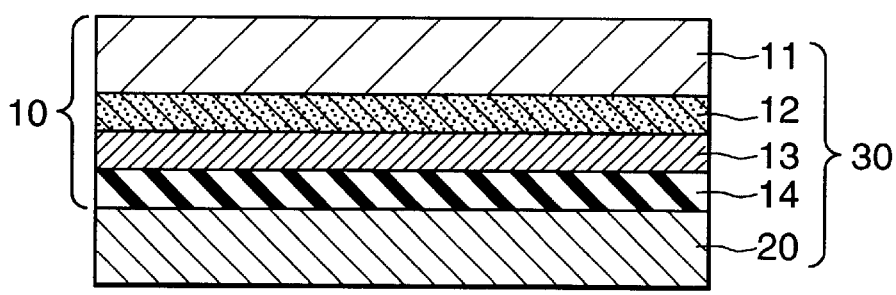

In the step shown in FIG. 1C, a single-crystal Si substrate is prepared as a second substrate 20. The first substrate 10 and the second substrate 20 are brought into tight contact with each other at room temperature while making the $SiO_2$ layer 14 of the first substrate 10 oppose the second substrate 20. After this, the first substrate 10 and second substrate 20 are bonded by anodic bonding, pressing, heating, or a combination thereof. With this process, a bonded substrate stack 30 in which the second substrate 20 and $SiO_2$ layer 14 are firmly bonded is formed. The $SiO_2$ layer 14 may be formed on the single-crystal Si layer 13, as described above. Alternatively, the insulating layer 14 may be formed either on the second substrate 20 or on both substrates as far as the state shown in FIG. 1C is obtained upon bringing the first and second substrates into tight contact with each other.

Figure 1D:
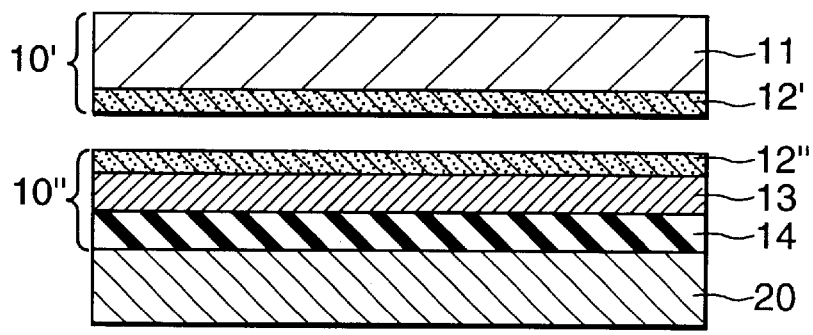

In the step shown in FIG. 1D, the bonded substrate stack 30 is separated at the porous Si layer 12. The second substrate side (10"+20) has a multilayered structure of porous Si layer 12"/single-crystal Si layer 13/insulating layer 14/single-crystal Si substrate 20. The first substrate side (10') has a structure wherein a porous Si layer 12' is formed on the single-crystal Si substrate 11.

After the remaining porous Si layer 12' is removed, and the surface of the porous Si layer 12' is planarized as needed, the separated first substrate (10') is used as a second substrate 20 or a single-crystal Si substrate 11 for forming a first substrate 10 again.

Figure 1E:
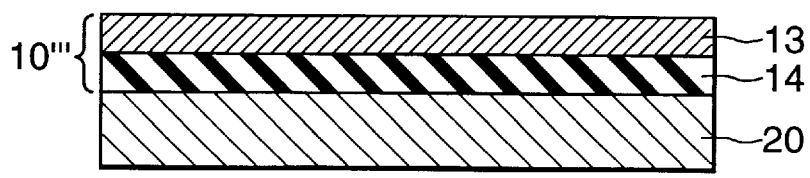

After the bonded substrate stack 30 is separated, in the step shown in FIG. 1E, the porous layer 12" on the surface on the second substrate side (10"+20) is selectively removed. With this process, a substrate having a multilayered structure of a single-crystal Si layer 13/insulating layer 14/single-crystal Si substrate 20, i.e., an SOI structure is obtained.

In this embodiment, in the step shown in FIG. 1D, i.e., in separating the bonded substrate stack 30, a separating apparatus is used, which ejects a high-pressure liquid or gas (fluid) to the porous Si layer as a separation layer to separate the substrates into two substrates in the separation region.

Basic Arrangement of Separating Apparatus

This separating apparatus uses the water jet method. Generally, the water jet method ejects a high-speed, high-pressure stream of water to an object to, e.g., cut or process a ceramic, metal, concrete, resin, rubber, or wood, remove a coating film from the surface, or clean the surface ("Water Jet", Vol. 1, No. 1, page 4 (1984)).

This separating apparatus ejects a high-speed, high-pressure stream of fluid to the porous layer (separation region) as a fragile structure of a bonded substrate stack in the planar direction of the bonded substrate stack to selectively break the porous layer, thereby separating the substrate stack at the porous layer. The stream will be referred to as a "jet" hereinafter. As a fluid forming the jet, it is possible to use water, an organic solvent such as alcohol, an acid such as hydrofluoric acid or nitric acid, an alkali such as potassium hydroxide, a gas such as air, nitrogen gas, carbonic acid gas, a rare gas, or an etching gas, or a plasma.

This separating apparatus ejects a jet to the porous layer (separation layer) of a bonded substrate stack to remove the porous layer from the outer peripheral portion to the central portion. With this process, only the separation region where the mechanical strength is low is removed without damaging the main body portion, and the bonded substrate stack is separated into two substrates.

The nozzle for ejecting the jet can employ not only a circular shape but also various shapes. For example, when a slit-like nozzle is employed to eject a jet with a long rectangular section, the jet can be efficiently ejected to the separation layer.

The jet ejecting conditions can be determined in accordance with, e.g., the type of separation region (e.g., a porous layer) or the shape of the circumferential surface of the bonded substrate stack. As the jet ejecting conditions, for example, pressure to be applied to the fluid, jet scanning speed, nozzle width or diameter (the diameter is substantially the same as the jet diameter), nozzle shape, distance between the nozzle and the separation layer, and flow rate of the jet are used as important parameters.

To prevent damage to the substrate, the separation force applied in the axial direction of the bonded substrate stack is preferably, e.g., several hundred gf per cm$^2$.

Figure 2:
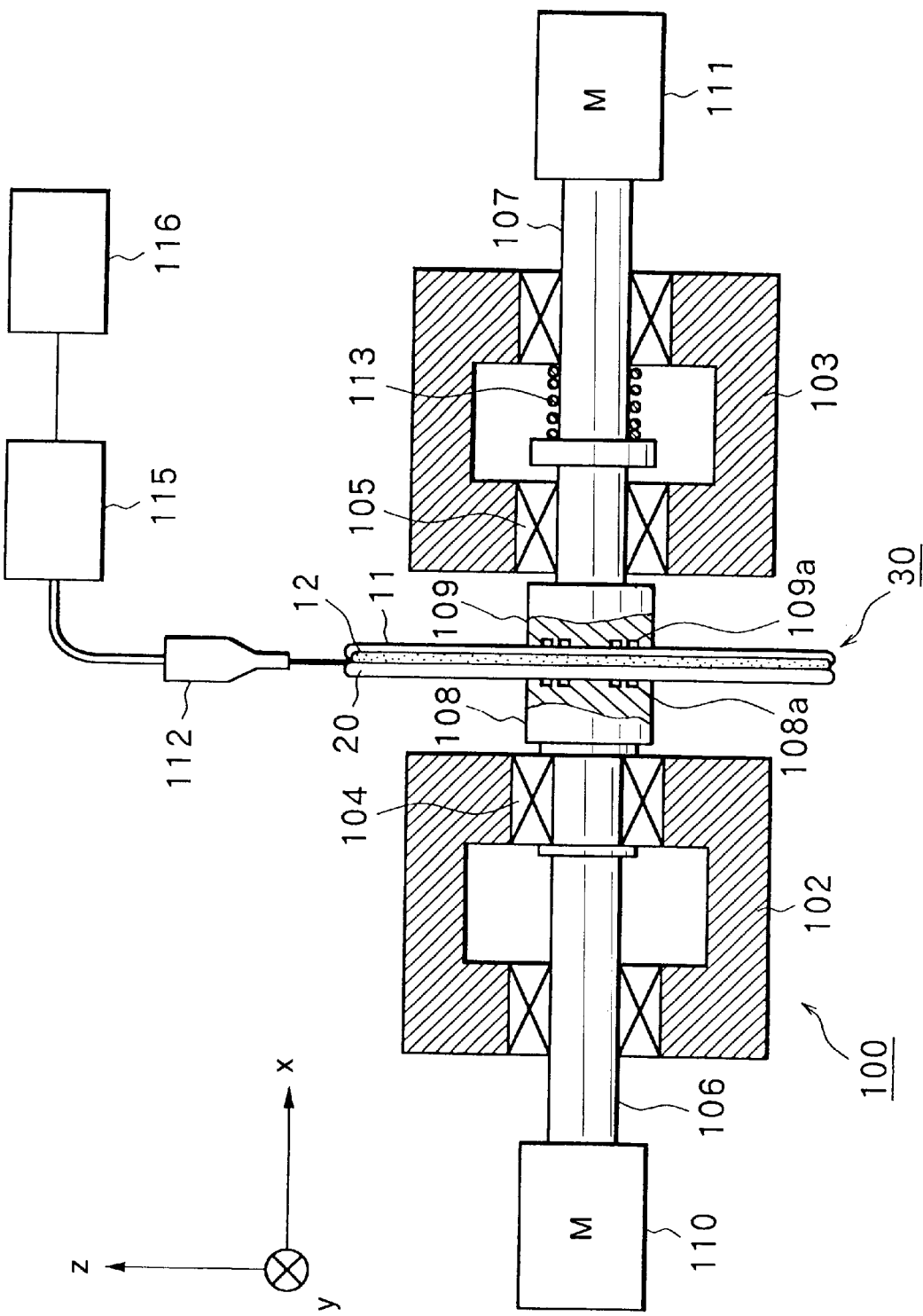
FIG. 2 is a view showing the schematic arrangement of a separating apparatus according to the preferred embodiment of the present invention.

FIG. 2 is a view showing the schematic arrangement of a separating apparatus according to a preferred embodiment of the present invention. A separating apparatus 100 injects a jet into the porous layer 12 while rotating the bonded substrate stack 30 to separate the bonded substrate stack into two substrates.

The separating apparatus 100 has substrate holding portions 108 and 109 having vacuum chuck mechanisms 108a and 109a. The substrate holding portions 108 and 109 sandwich the bonded substrate stack 30 from both sides and hold it. The bonded substrate stack 30 has the porous layer 12 as a fragile structure, as described above, and is separated into two substrates by the separating apparatus 100 at the porous layer 12 (FIG. 1D).

The substrate holding portions 108 and 109 are located on one rotation axis. The substrate holding portion 108 is coupled to one end of a rotating shaft 106 rotatably axially supported by a support table 102 via a bearing 104. The other end of the rotating shaft 106 is coupled to the rotating shaft of a driving source (e.g., a motor) 110 fixed to a support portion 110. The bonded substrate stack 30 vacuum-chucked by the substrate holding portion 108 is rotated by a rotational force generated by the driving source 110. For separation of the bonded substrate stack 30, the driving source 110 rotates the rotating shaft 106 at a designated rotational speed in accordance with an instruction from a controller (not shown).

The substrate holding portion 109 is coupled to one end of a rotating shaft 107 slidably and rotatably axially supported by a support portion 103 via a bearing 105. The other end of the rotating shaft 107 is coupled to the rotating shaft of a driving source (e.g., a motor ) 111. The speed at which the driving source 110 rotates the rotating shaft 106 must match the speed at which the driving source 111 rotates the rotating shaft 107 to prevent twist of the bonded substrate stack 30.

Both of the driving sources 110 and 111 need not always be used, and any one of the driving sources may be used. For example, when only the driving source 110 is used, the rotating shaft 106, substrate holding portion 108, bonded substrate stack 30, substrate holding portion 109, and rotating shaft 107 integrally rotate before separation of the bonded substrate stack 30. After the bonded substrate stack 30 is separated into two substrates, the units on the rotating shaft 107 side stand still.

Alternatively, the rotational force generated by one driving source may be branched to rotate the rotating shafts 106 and 107, respectively by the branched rotational forces.

The support portion 103 supporting the rotating shaft 107 has a spring 113 for pressing the bonded substrate stack 30. Hence, even when the vacuum chuck mechanisms 108a and 109a do not chuck the bonded substrate stack 30, the two substrates separated by the jet ejected from an ejection nozzle 112 do not drop. When the bonded substrate stack 30 is pressed, the bonded substrate stack 30 can be stably held during separation.

The rotating shaft 106 side can also have a spring for pressing the bonded substrate stack 30.

A high-pressure pump 115 is connected to the ejection nozzle 112. The high-pressure pump 115 supplies a high-pressure fluid (e.g., water) to the ejection nozzle 112, and a jet is ejected from the ejection nozzle 112. Pressure applied from the high-pressure pump 115 to the fluid is controlled by a pressure control section 116.

Figure 4:
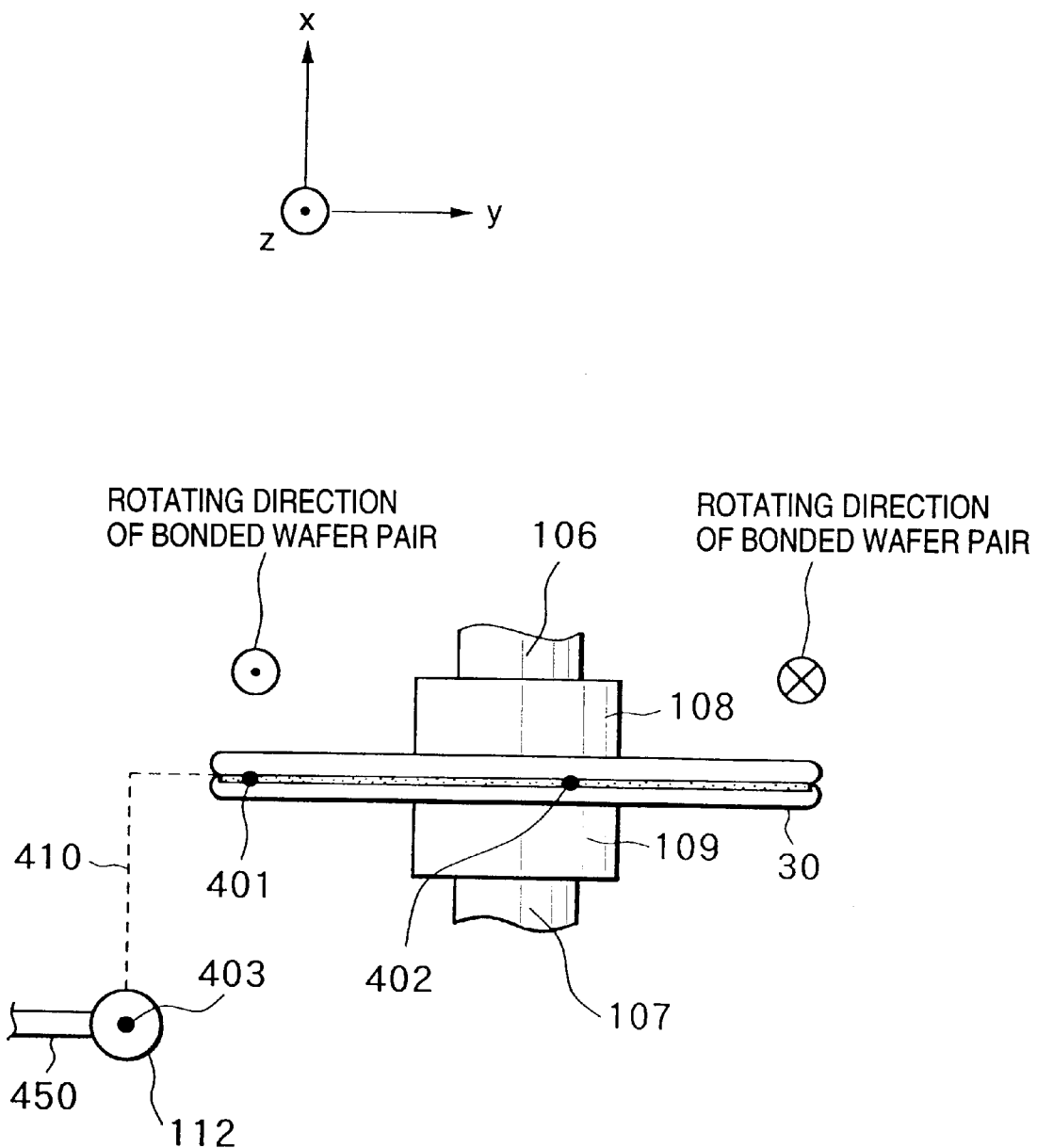
FIG. 4 is a view showing the moving path of an ejection nozzle driven by a driving robot.

The separating apparatus 100 has a driving robot for driving the ejection nozzle 112. FIG. 4 is a view showing the moving path of the ejection nozzle driven by the driving robot.

A driving robot 450 moves the ejection nozzle 112 along a path 410. When the bonded substrate stack 30 is to be held by the substrate holding portions 108 and 109 or separated substrates are to be detached from the substrate holding portions 108 and 109, the driving robot 450 moves the ejection nozzle 112 to a retreat position 403. When the bonded substrate stack 30 is to be separated, the driving robot 450 moves the ejection nozzle 112 onto the porous layer 12 of the bonded substrate stack 30.

In this embodiment, to separate the peripheral portion of the bonded substrate stack 30, the ejection nozzle 112 is located at a first operation position 401. After that, the separation process is continued while moving the ejection nozzle 112 from the first operation position 401 to a second operation position 402.

In this embodiment, during separation of the peripheral portion of the bonded substrate stack 30, the rotational direction of the bonded substrate stack 30 (rotating direction of bonded wafer pair), the fluid ejection direction (moving direction), and the first operation position 401 (position of the ejection nozzle 112) maintain a predetermined relationship. FIG. 5 is a view for explaining the relationship between the rotational direction of the bonded substrate stack 30, the fluid ejection direction, and the first operation position (position of the ejection nozzle 112) 401.

More specifically, in the separating apparatus 100 according to this embodiment, the relationship between the rotational direction of the bonded substrate stack 30, the fluid ejection direction, and the first operation position (position of the ejection nozzle 112) 401 is determined such that when the velocity of the bonded substrate stack 30 at the position where the fluid ejected from the ejection nozzle 112 is injected is represented by V, and the moving direction of the fluid (jet) is represented by A, the A-direction component of the velocity V (vector) of the bonded substrate stack 30 has a negative value ($|V|\cos\theta < 0$). This condition will be referred to as a peripheral portion separation condition hereinafter.

More specifically, when fluid (jet) moves in the vertical direction (negative direction of the Z-axis), as in this embodiment, and the bonded substrate stack 30 is rotated in a direction indicated by an arrow R in FIG. 5, the first operation position 401 is located within a range B shown in FIG. 5.

As described above, when the peripheral portion of the bonded substrate stack 30 is to be separated at the porous layer 12, the rotational direction of the bonded substrate stack 30, the fluid ejection direction, and the position of the ejection nozzle 112 are controlled such that the peripheral portion separation condition is satisfied. This effectively prevents defects in separation.

The propriety of this embodiment will be described by comparing the progress of separation when the peripheral portion separation condition is satisfied with that when the peripheral portion separation condition is not satisfied.

Figure 6:
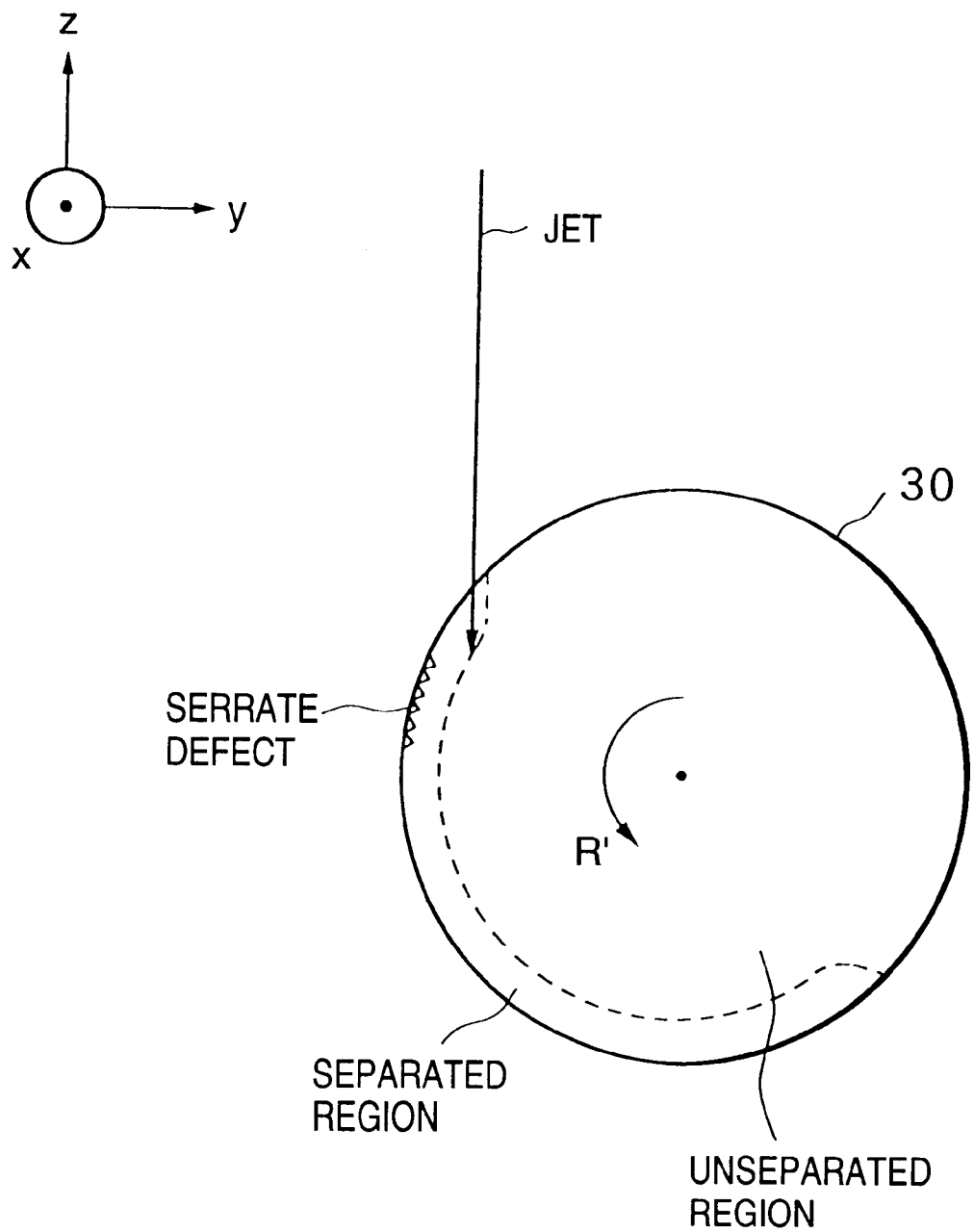
FIG. 6 is a view schematically showing the progress of separation of a bonded substrate stack when peripheral portion separation condition is not satisfied.

FIG. 6 is a view schematically showing the progress of separation of a bonded substrate stack when peripheral portion separation condition is not satisfied. Referring to FIG. 6, the "separated region" means a region that has already been separated, and the "unseparated region" means a region that has not been separated yet (this also applies to FIG. 7).

When the bonded substrate stack 30 is separated without satisfying the peripheral portion separation condition, the single-crystal Si layer 13 is peeled off from the insulating layer 14 at the peripheral portion of the bonded substrate stack 30. The single-crystal Si layer 13 at the peripheral portion may break. If this phenomenon intermittently occurs as separation progresses, a defective portion (serrate defect) where the single-crystal Si layer 13 breaks in a serrate shape may be generated, as shown in FIG. 6.

A cause is estimated as follows. When the peripheral portion separation condition is not satisfied, the fluid ejected from the ejection portion 112 always collides against the outermost peripheral portion of the bonded substrate stack 30 to break that portion from the outside.

Figure 12:
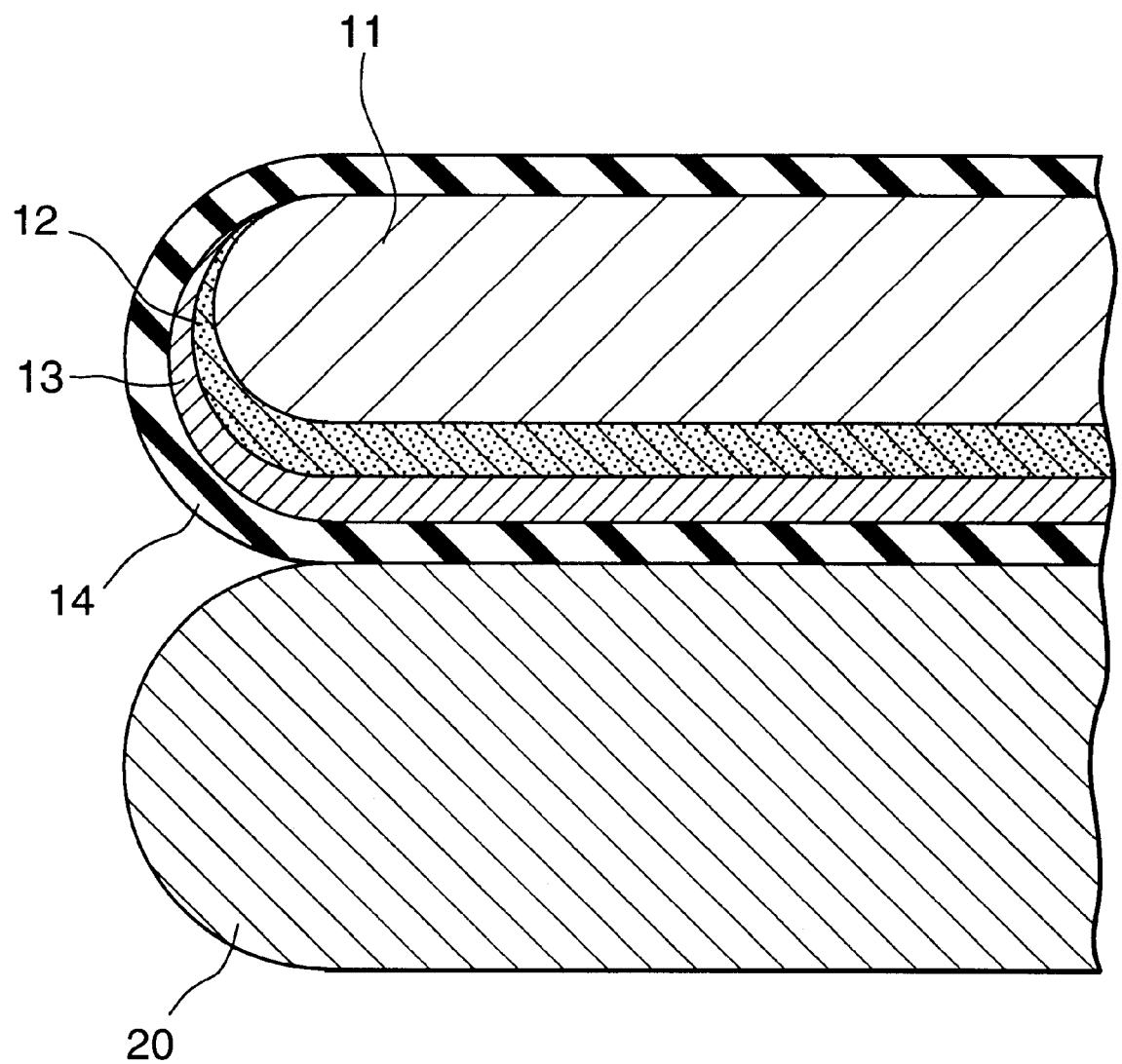
FIG. 12 is a sectional view showing a representative bonded substrate stack.

In the bonded substrate stack 30, the single-crystal Si layer 13 or insulating layer 14 formed on the porous layer 12 often covers the outermost peripheral portion of the bonded substrate stack 30, as shown in FIG. 12.

However, the fluid externally injected into the bonded substrate stack 30 does not always easily break both of the single-crystal Si layer 13 and insulating layer 14 at the outermost peripheral portion and reach the porous layer 12.

That is, the serrate defect is generated probably because the fluid externally injected into the bonded substrate stack 30 breaks the interface between the single-crystal Si layer 13 and the insulating layer 14, and accordingly, the single-crystal Si layer 13 is peeled from the insulating layer 14.

Figure 7:
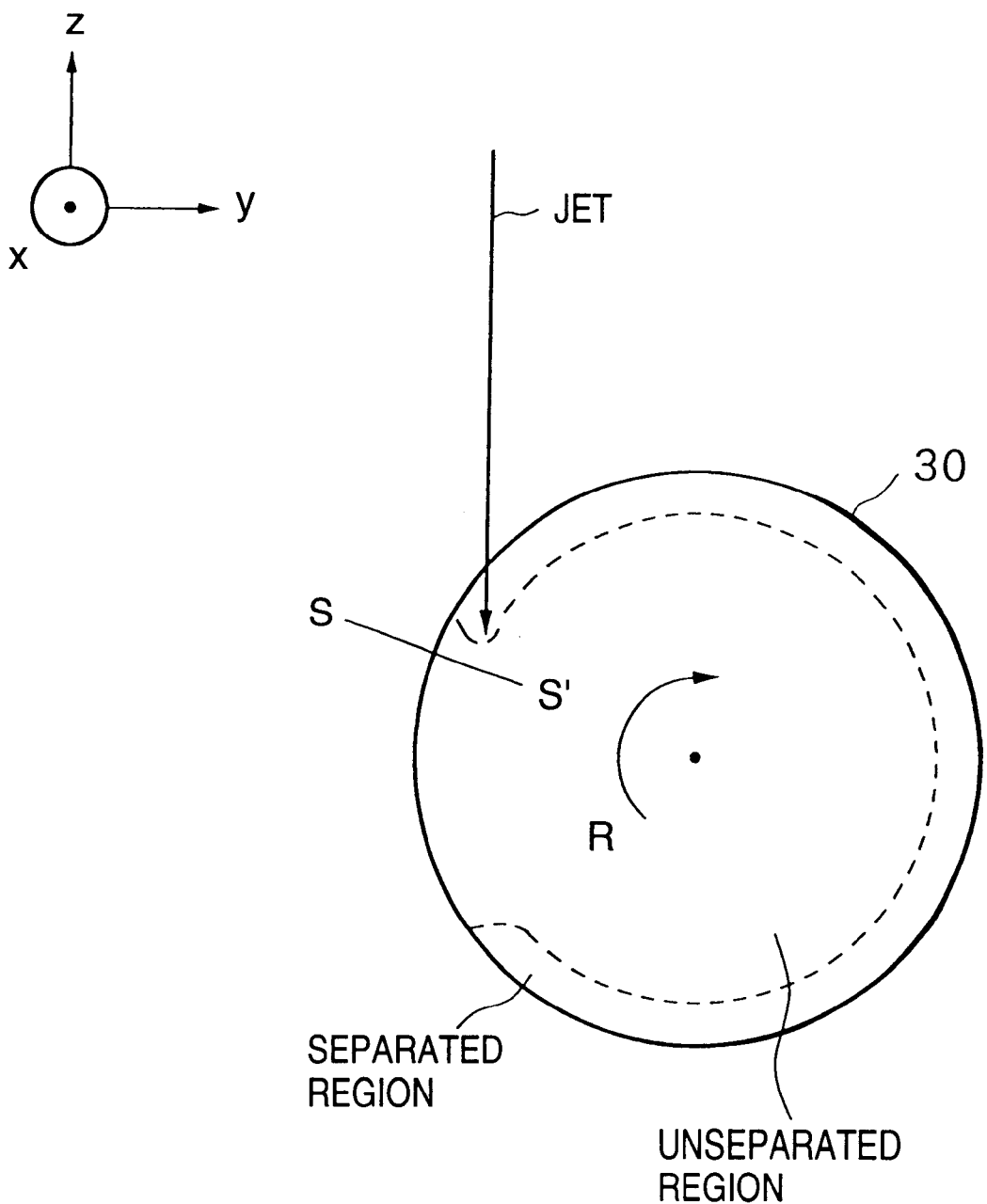
FIG. 7 is a view schematically showing the progress of separation of a bonded substrate stack when the peripheral portion separation condition is satisfied.

FIG. 7 is a view schematically showing the progress of separation of a bonded substrate stack when the peripheral portion separation condition is satisfied. The rotational direction of the bonded substrate stack is reverse to that of the example shown in FIG. 6.

When the peripheral portion separation condition is satisfied, no serrate defect is generated. This is estimated due to the following reason, though it is not completely clarified.

When the peripheral portion separation condition is satisfied, and the peripheral portion of the bonded substrate stack 30 is to be separated, the fluid injected into the porous layer 12 inside the outermost peripheral portion of the bonded substrate stack 30 breaks the porous layer 12 at the outermost peripheral portion from the inside to the outside except at the separation start position. Since only the porous layer 12 as the separation layer having the most fragile structure is readily broken, separation does not progress along the interface between the single-crystal Si layer 13 and the insulating layer 14.

Figure 8:
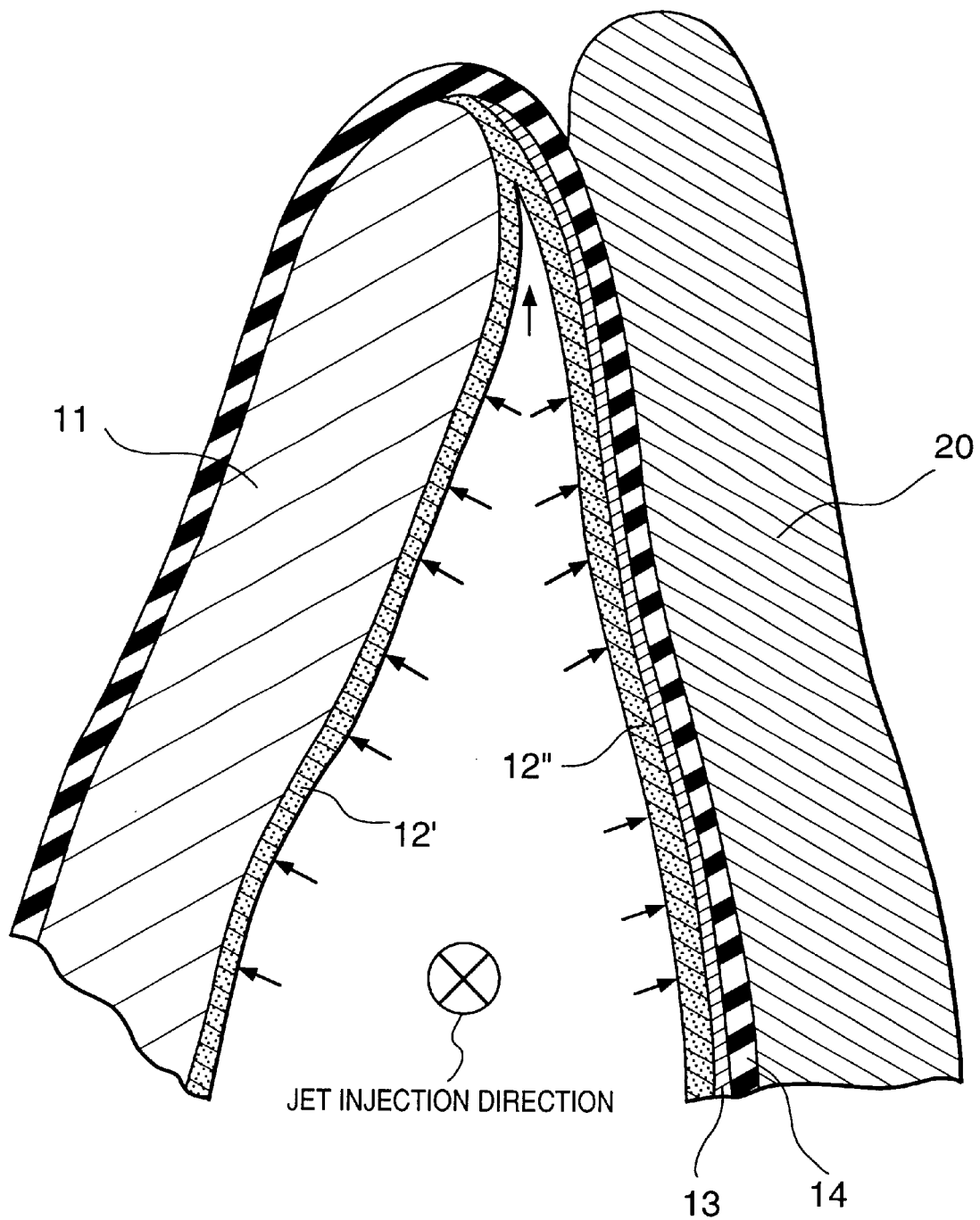
FIG. 8 is a view schematically showing the section of the bonded substrate stack shown in FIG. 7, which is taken along a line S–S'.

FIG. 8 is a view schematically showing the section of the bonded substrate stack shown in FIG. 7, which is taken along a line S–S'. As is indicated by an arrow in FIG. 8, because of the fluid injected through the already separated portion, pressure acts on the inside of the outermost peripheral portion of the bonded substrate stack 30 to tear the porous layer 12. Separation of the bonded substrate stack 30 progresses not only toward the inside but also toward the outside.

Bonded substrate stacks each having a porous layer 12 with a two-layered structure in which the upper layer was 4.5 μm thick and the lower layer 2 μm thick were separated using an ejection nozzle 112 having a diameter of 0.1 mm. When the jet pressure was 500 kgf/cm² or more, no serrate defects were generated in any samples. When the jet pressure was set at 400 kgf/cm², some samples had serrate defects. No experiments were conducted for the porous layer 12 with the above condition. When bonded substrate stacks were separated using an ejection nozzle having a diameter of 0.15 mm, and the jet pressure exceeded, e.g., 1,500 kgf/cm², some substrates cracked by the jet pressure. Hence, even for the porous layer 12 with the above condition, when the jet pressure is too high, the substrate may crack.

As a consequence, a jet having predetermined range of pressure which allows separation of the outermost peripheral portion of a bonded substrate stack from the inside to the outside and does not crack the substrate can be effectively used to prevent any defects.

Supposedly, this result changes depending on various factors such as the structure of the porous layer including the porosity of the porous layer 12, the number of stacked layered, and the thickness, the thicknesses of the semiconductor substrate 11 and second substrate, the thickness of the single-crystal Si layer 13, the thickness of the insulating layer 14, the jet injection position, and the diameter of the ejection nozzle.

The arrangement of the separating apparatus 100 will be described again. The separating apparatus 100 also has an adjustment mechanism for adjusting the interval between the substrate holding portion 108 and the substrate holding portion 109. Arrangement examples of the adjustment mechanism will be described below.

FIG. 9 is a view showing the first arrangement example of the adjustment mechanism. The adjustment mechanism shown in FIG. 9 uses an air cylinder 122. The air cylinder 122 is fixed to, e.g., the support portion 103 and moves the driving source 111 by a piston rod 121. To set the bonded substrate stack 30 in the separating apparatus 100, the air cylinder 122 is controlled such that the driving source 111 is moved in the direction in which the interval between the substrate holding portion 108 and the substrate holding portion 109 increases (positive direction of the X-axis). In this state, the bonded substrate stack 30 is inserted between the substrate holding portion 108 and the substrate holding portion 109. When drive of the piston rod 121 by the air cylinder 122 is canceled, the substrate holding portion 109 presses the bonded substrate stack 30 by the function of the spring 113.

Figure 10:
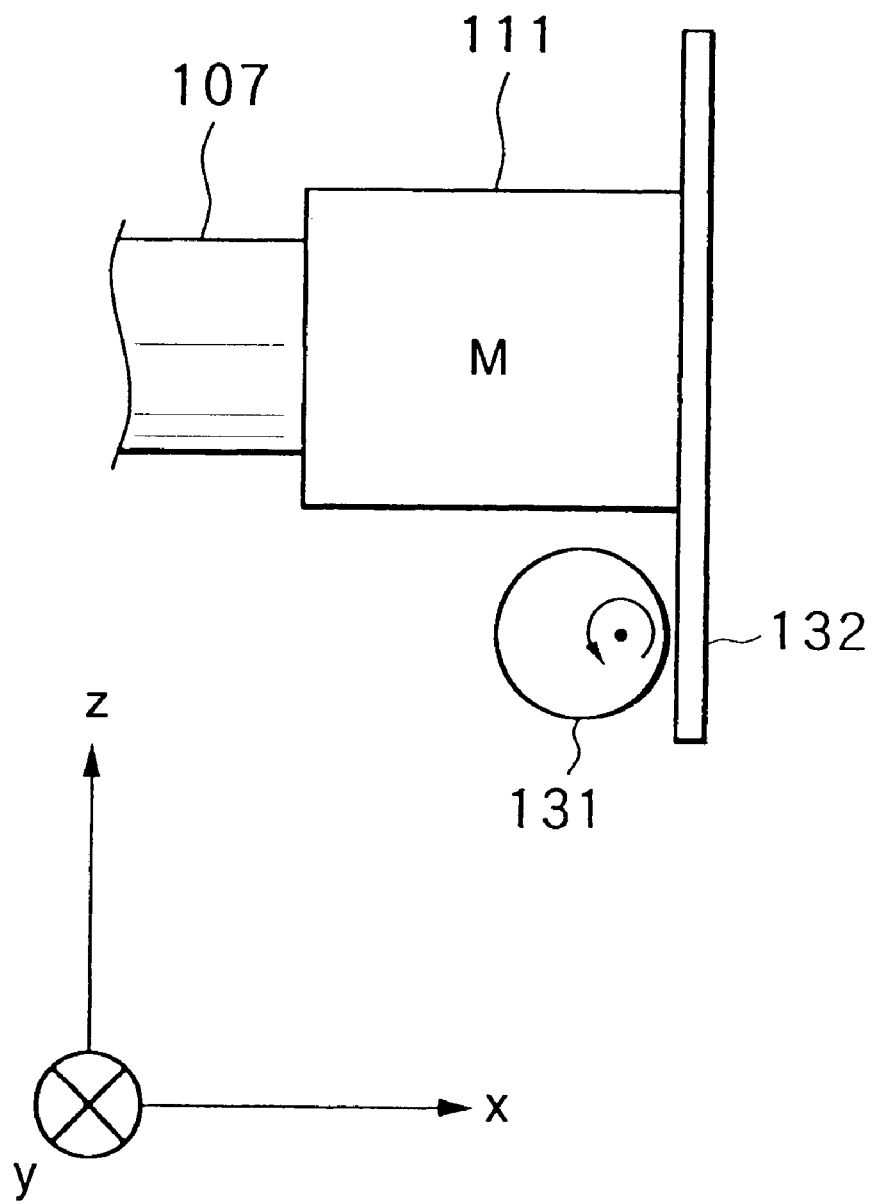
FIG. 10 is a view showing the second arrangement of the adjustment mechanism for adjusting the interval between the substrate holding portions.

FIG. 10 is a view showing the second arrangement example of the adjustment mechanism. The adjustment mechanism shown in FIG. 10 uses an eccentric cam 131 and motor. The eccentric cam 131 is coupled to a motor (not shown) and adjusts the interval between the substrate holding portion 108 and the substrate holding portion 109 by moving a driving plate 132 coupled to the rear end of the motor 111. As described above, a force in the negative direction of the X-axis acts on the rotating shaft 107 due to the spring 113. In holding the bonded substrate stack 30, a gap is formed between the eccentric cam 131 and the driving plate 132. Hence, in holding the bonded substrate stack 30, a press force acts on the bonded substrate stack 30.

Another mechanism for adjusting the interval between the substrate holding portion 108 and the substrate holding portion 109 may be arranged on the substrate holding portion 108 side.

Bonded substrate stack separation processing by the separating apparatus 100 will be described next.

To set the bonded substrate stack 30 in the separating apparatus 100, first, the bonded substrate stack 30 is conveyed between the substrate holding portion 108 and the substrate holding portion 109 by, e.g., a conveyor robot and held while matching the center of the bonded substrate stack 30 with the center of the substrate holding portions 108 and 109. The substrate holding portion 108 vacuum-chucks the bonded substrate stack 30.

The substrate holding portion 109 is pressed against the bonded substrate stack 30 by the force of the spring 113. More specifically, when the adjustment mechanism shown in FIG. 9 is employed as the adjustment mechanism for adjusting the interval between the substrate holding portion 108 and the substrate holding portion 109, drive of the piston rod 121 by the air cylinder 122 is canceled. When the adjustment mechanism shown in FIG. 10 is employed as the adjustment mechanism, the eccentric cam 131 is rotated such that the press force of the spring 113 acts on the bonded substrate stack 30.

When separation processing is to be executed, the vacuum chuck mechanisms 108a and 109a either may or may not vacuum-chuck the bonded substrate stack 30. This is because the bonded substrate stack 30 is held by the press force of the spring 113. However, if the press force is made weak, the bonded substrate stack 30 is preferably vacuum-chucked.

Next, the rotating shafts 106 and 107 are synchronously rotated by the driving sources 110 and 111. Note that the rotational direction is the direction shown in FIG. 5, i.e., the direction in which the peripheral portion separation condition is satisfied in entirely separating the peripheral portion of the bonded substrate stack 30 at the first operation position 401.

A high-pressure fluid (e.g., water) is fed from the high-pressure pump 115 into the ejection nozzle 112 while controlling pressure by the pressure control section 116. The ejection nozzle 112 ejects a high-speed, high-pressure jet.

The ejection nozzle 112 is moved from the retreat position 403 to the first operation position 401 by the driving robot 450. The jet is injected to a portion near the porous layer 12 of the bonded substrate stack 30. In this state, processing waits until the bonded substrate stack 30 rotates by one or more revolutions, and the peripheral portion of the bonded substrate stack 30 is entirely separated. After that, the ejection nozzle 112 is gradually moved to the second operation position 402 by the driving robot 450. The second operation position 402 is a position near or passing the position immediately above the center of the bonded substrate stack 30. The bonded substrate stack 30 is completely separated into two substrates while the ejection nozzle 112 is moving to the second operation position 402.

Figure 3:
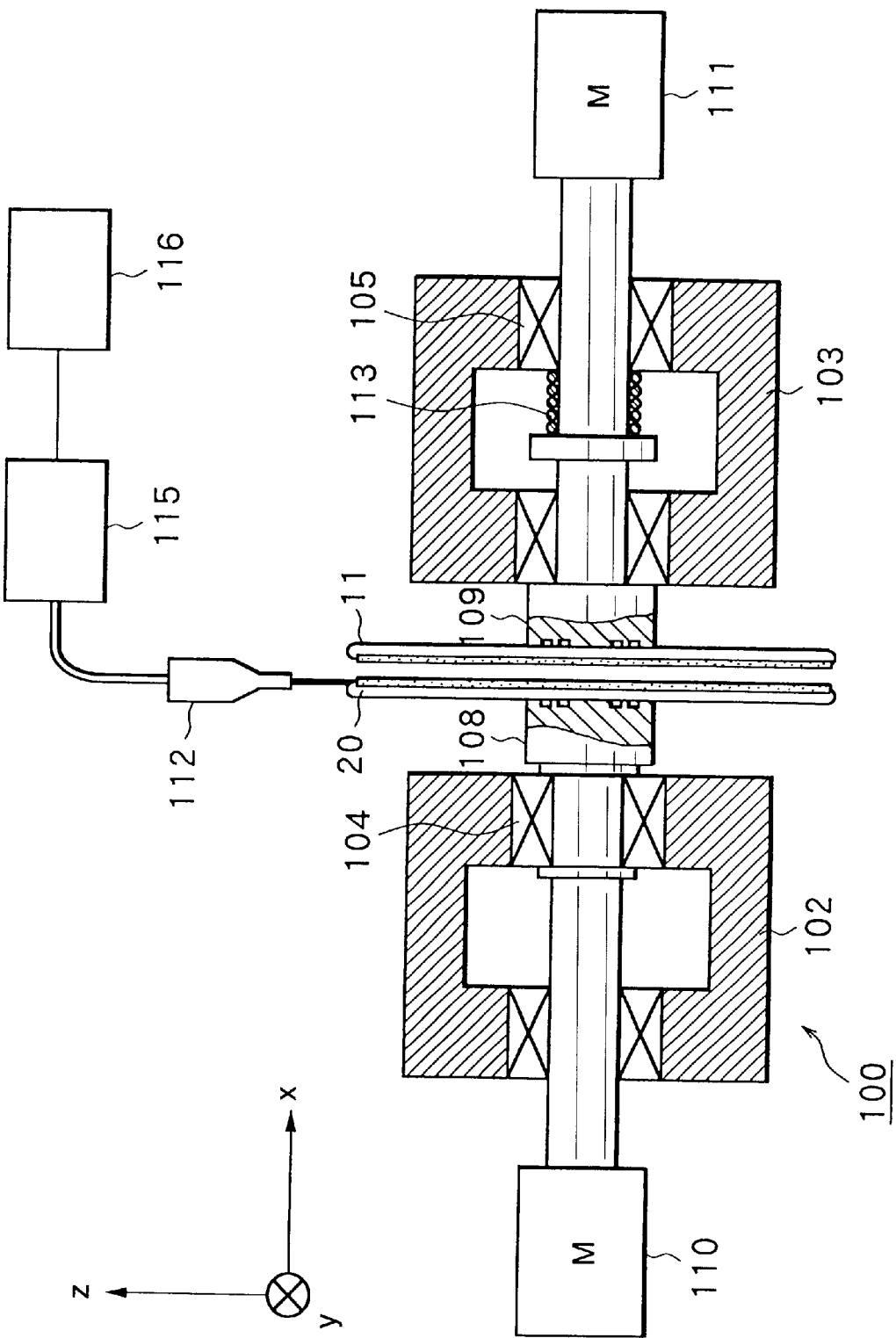
FIG. 3 is a view showing the schematic arrangement of the separating apparatus according to the preferred embodiment of the present invention

Next, as shown in FIG. 3, the two substrates separated physically are spaced apart from each other while keeping the jet injected into the bonded substrate stack 30. More specifically, for example, when the adjustment mechanism shown in FIG. 9 is employed as the adjustment mechanism for adjusting the interval between the substrate holding portion 108 and the substrate holding portion 109, the piston rod 121 is driven in the positive direction of the X-axis (direction in which the spring 113 contracts) by the air cylinder 122 while keeping the substrates vacuum-chucked by the substrate holding portions 108 and 109. When the adjustment mechanism shown in FIG. 10 is employed as the adjustment mechanism, the eccentric cam 131 is pivoted to drive the rotating shaft 107 in the positive direction of the X-axis (direction in which the spring 113 contracts) while keeping the substrates vacuum-chucked by the substrate holding portions 108 and 109.

As shown in FIG. 3, when the two separated substrates are completely spaced apart from each other, the driving robot 450 moves the ejection nozzle 112 to the standby position 403.

Ejection of the jet is stopped, and the substrates are detached from the substrate holding portions 108 and 109 by, e.g., a conveyor robot.

In the above separation processing, the bonded substrate stack 30 may be separated while changing the jet pressure. The reason for this is as follows.

The jet pressure necessary for separating the bonded substrate stack 30 changes in units of regions of the bonded substrate stack 30. For example, the separation force acting on the peripheral portion of the bonded substrate stack 30 is different from that acting on the central portion. That is, the jet pressure necessary for separation changes between the peripheral portion and the central portion. If the bonded substrate stack 30 is separated using predetermined jet pressure, the jet at high pressure is always used during separation processing. In this case, the bonded substrate stack or separated substrates may crack or may be damaged at high probability, resulting in low yield.

To solve this problem, the mechanical strength of the separation region may be decreased. However, if the separation region is made too fragile, the separation region readily breaks in bonding two substrates (first and second substrates), cleaning, and other processes. This makes it difficult to manufacture a substrate with a desired quality. In addition, particles may be generated from the broken separation region and contaminate the manufacturing apparatus and the like.

Figure 11:
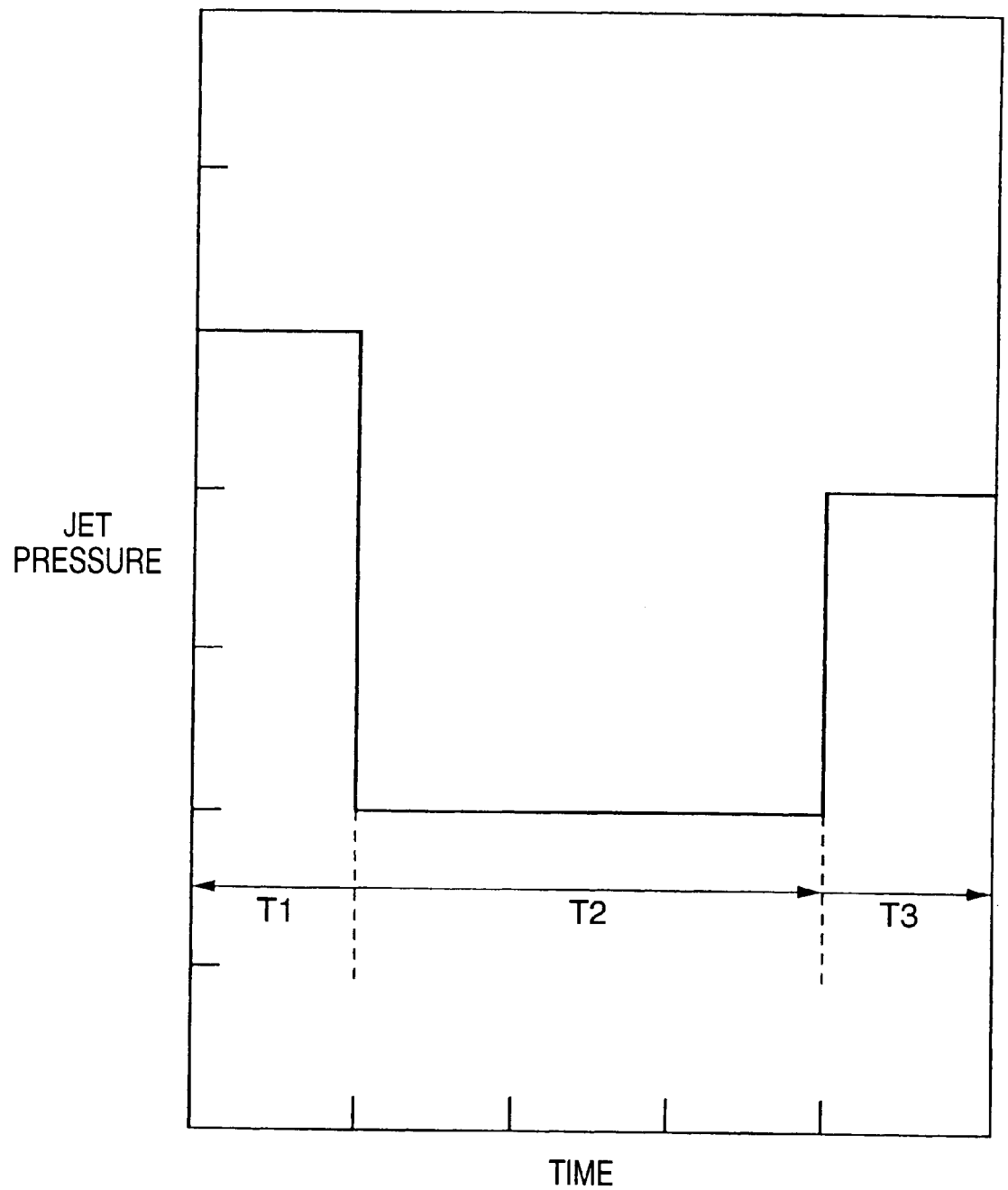
FIG. 11 is a graph showing an example of control of jet pressure during separation processing.

FIG. 11 is a graph showing an example of control of jet pressure during separation processing. More specifically, on the basis of the control procedures shown in FIG. 11, the pressure control section 116 controls pressure (jet pressure) generated by the high-pressure pump 115.

In the example shown in FIG. 11, the jet pressure is adjusted in three stages. In a period T1, the peripheral portion of the bonded substrate stack 30 is separated while keeping the ejection nozzle 112 located at the operation position 401. In this period T1, the jet pressure is set to be high because the fluid injected into the bonded substrate stack 30 is readily discharged, and the separation force hardly acts on the bonded substrate stack 30.

In a period T2, the intermediate portion (to be simply referred to as an intermediate portion hereinafter) between the peripheral portion and the central portion of the bonded substrate stack 30 is separated while moving the ejection nozzle 112 to the second operation position 402. At the intermediate portion, the speed of the fluid (jet) reduces because it passes through the internal portion of the bonded substrate stack 30. The function of separating the bonded substrate stack 30 by the impact of collision of the fluid against the porous layer 12 weakens. However, the intermediate portion has few discharge paths for the fluid injected into the bonded substrate stack 30. For this reason, the separation force due to the pressure of the fluid injected into the bonded substrate stack 30 increases, and the bonded substrate stack 30 is separated mainly by this separation force.

In a period T3, the central portion of the bonded substrate stack 30 is separated. When the separated portion comes close to the central portion, the separated portion of the bonded substrate stack 30 warps, and the discharge paths for the fluid increase. The pressure of the fluid becomes lower than that during separation of the intermediate portion, and the separation force becomes small. Hence, at the central portion, the pressure of the fluid is preferably set to be higher than that during separation of the intermediate portion.

As the member to be separated by the separating apparatus 100, only the bonded substrate stack 30 manufactured by the manufacturing method shown in FIGS. 1A to 1E has been described above. However, the separating apparatus 100 can be suitably used to separate not only the bonded substrate stack 30 but also a disk-like member having a separation layer. That is, the bonded substrate stack 30 can be regarded as a preferable example of a disk-like member having a separation layer. Disk-like members also include a substrate having an orientation flat or a notch.

EXAMPLE

A preferred example of the present invention will be described below.

A first p- or n-type single-crystal Si substrate 11 having a resistivity of 0.01 Ω·cm was anodized in an HF solution in two steps to form a porous layer 12 having a two-layered structure (step shown in FIG. 1A). The anodizing conditions were as follows.

<First Anodizing>
Current density: 7 (mA/cm$^2$)
Anodizing solution: HF: $H_2O$:$C_2H_5OH$=1:1:1
Time: 10 (min)
First porous Si thickness: 4.5 ($\mu$m)

<Second Anodizing>
Current density: 20 (mA/cm$^2$) Anodizing solution: HF: $H_2O$:$C_2H_5OH$=1:1:1
Time: 2 (min)
Second porous Si thickness: 2 ($\mu$m)

The functions of the two layers of the porous Si layer 12 were separated such that the surface porous Si layer formed first by anodizing using a low current was used to form a high-quality epitaxial Si layer, and the lower porous Si layer formed later by anodizing using a high current (the layer having a higher porosity) was used as a separation layer. The thickness of the porous Si layer formed at a low current is not limited to the above thickness (4.5 $\mu$m) but is preferably several hundred to 0.1 $\mu$m. The porous Si layer formed at a high current is not limited to the above thickness, either, and only need ensure a thickness that allows separation of the bonded substrate stack at a jet.

After formation of the second porous Si layer, a third and subsequent layers having different porosities may be formed.

This substrate was oxidized in an oxygen atmosphere at 400° C. for 1 hr. With this oxidation, the inner walls of holes in the porous Si layer were covered with thermal oxide films. The surface of this porous Si layer was treated with hydrofluoric acid to remove only the oxide film on the surface of the porous Si layer while leaving the oxide films on the inner walls of the holes. After that, a 0.3-$\mu$m thick single-crystal Si layer 13 was epitaxially grown on the porous Si layer 12 by CVD (Chemical Vapor Deposition) The growth conditions were as follows.

Source gas: $SiH_2Cl_2$/$H_2$
Gas flow rate: 0.5/180 (1/min)
Gas pressure: 80 (Torr)
Temperature: 900 (°C.)
Growth rate: 0.3 ($\mu$m/min)

A 200-nm thick oxide film ($SiO_2$ layer) 14 was formed on the surface of the epitaxial Si layer 13 by thermal oxidation as an insulating layer (step shown in FIG. 1B)

After this substrate and an independently prepared second Si substrate 20 were stacked such that the surface of the $SiO_2$ layer 14 opposed the surface of the second Si substrate 20, annealing was performed at 1,100° C. for 1 hr to bond the two substrates (step shown in FIG. 1C).

A bonded substrate stack 30 formed in the above way was separated by a separating apparatus 100 shown in FIG. 2 (step shown in FIG. 1D). Details will be described later.

First, the bonded substrate stack 30 was vertically supported between a substrate holding portion 108 and a substrate holding portion 109. The substrate holding portion 109 was pressed against the bonded substrate stack 30 by the force of a spring 113. In this state, vacuum chuck mechanisms 108a and 109a vacuum-chucked the bonded substrate stack 30 on the substrate holding portions 108 and 109.

Rotating shafts 106 and 107 were synchronously rotated by driving sources 110 and 111, respectively. The rotational direction was set in the direction shown in FIG. 5, i.e., a direction in which the peripheral portion separation condition was satisfied in separating the peripheral portion of the bonded substrate stack 30 at a first operation position 401.

Water as a fluid was fed from a high-pressure pump 115 to an ejection nozzle 112, and the process waited until the jet stabilized. Jet pressure was set at 500 kgf/cm$^2$ under the control of a pressure control section 116. In this example, the ejection nozzle 112 having a diameter of 0.1 mm was used.

After the jet stabilized, a driving robot 450 moved the ejection nozzle 112 from a retreat position 403 to the first operation position 401. The peripheral portion separation condition was satisfied, and in this state, separation of the peripheral portion of the bonded substrate stack 30 started.

Separation progressed under the control of the high-pressure pump 115 as shown in FIG. 11. In 0 to 20 sec after the start of separation, the peripheral portion of the bonded substrate stack 30 was separated while maintaining the jet pressure at 500 kgf/cm$^2$ and keeping the ejection nozzle 112 fixed at the first operation position 401.

When 20 sec elapsed from the start of separation, and the peripheral portion of the bonded substrate stack 30 was entirely separated, separation processing was continued while moving the ejection nozzle 112 from the first operation position 401 to a second operation position 402 by the driving robot 450. In a period of 20 to 80 sec after the start of separation, the jet pressure was maintained at 200 kgf/cm$^2$. In a period of 80 to 100 sec after the start of separation, the jet pressure was maintained at 400 kgf/cm$^2$.

With the above process, the bonded substrate stack 30 was separated into two substrates without generating any serrate defects and the like at the peripheral portion. A number of bonded substrate stacks 30 were separated by the above method, and all bonded substrate stacks had no defects. When the rotational direction of the bonded substrate stacks 30 was reversed, i.e., the bonded substrate stacks 30 were separated without satisfying the peripheral portion separation condition, some bonded substrate stacks 30 had defects.

Next, the porous Si layer transferred to the second substrate of the two separated substrates was selectively etched using a solution mixture of 49% hydrofluoric acid and 30% hydrogen peroxide while stirring the solution (step shown in FIG. 1E). The single-crystal Si layer functioned as an etching stopper layer. The porous Si layer was selectively etched and completely removed.

The etching rate of the above etchant for non-porous Si is very low. The selectivity ratio of etching of porous Si to non-porous Si is 10$^5$ or more. Hence, the etching amount (about several ten Å) of the non-porous single-crystal Si layer 13 can be neglected in practical use.

With the above process, an SOI substrate having a 0.2-$\mu$m thick single-crystal Si layer 13 on the insulating layer 14 could be formed. The film thickness of the single-crystal Si layer 13 after selective etching of the porous Si layer was measured at 100 points on the entire surface. The film thickness was 201 nm±4 nm.

Section observation with a transmission electron microscope revealed no new crystal defects in the single-crystal Si layer, indicating that satisfactory crystallinity was maintained.

After the resultant structure was annealed in hydrogen at 1,100° C. for 1 hr, the surface roughness was evaluated with an atomic force microscope. The mean square roughness in a 50-μm square area was approximately 0.2 nm. This nearly equals that of a commercially available Si wafer.

Even when the insulating layer was formed not on the surface of the epitaxial layer but on the surface of the second substrate or on both surfaces, the same result as described above was obtained.

The porous Si layer remaining on the first substrate side was selectively etched using a solution mixture of water, 49% hydrofluoric acid, and 30% hydrogen peroxide while stirring the solution. When the surface of the resultant structure was treated by hydrogen annealing or surface polishing, the substrate could be reused as a first or second substrate.

According to the present invention, when a disk-like member such as a bonded substrate stack is to be separated, defects can be prevented.

The present invention is not limited to the above embodiments and various changes and modifications can be made within the spirit and scope of the present invention. Therefore, to apprise the public of the scope of the present invention, the following claims are made.

What is claimed is:

1. A separating apparatus for separating a disk-like member having a separation layer inside comprising:
    a holding mechanism for holding the disk-like member while rotating the disk-like member about an axis perpendicular to the separation layer; and
    a fluid ejection portion for injecting a stream of fluid into the separation layer of the disk-like member held by said holding mechanism to separate the disk-like member at the separation layer by the fluid,
    wherein to separate only a peripheral portion from the disk-like member, a rotational direction of the disk-like member, a moving direction of the fluid, and a position of said ejection portion are maintained to satisfy a condition,
    wherein the condition is expressed by $|v|\cos \theta < 0$ where (1) $\theta$ is the angle between the direction of the moving fluid and the direction of the velocity of the peripheral portion at the injection position and (2) $v$ is the velocity of the peripheral portion.

2. The apparatus according to claim 1, wherein when separating the peripheral portion of the disk-like member, said ejection portion ejects the fluid having pressure at which an outermost peripheral portion of the disk-like member is separated from an inside to an outside, except at the separation start position, by the fluid injected into the disk-like member.

3. The apparatus according to claim 1, further comprising a control section for controlling the pressure of the fluid ejected from said ejection portion.

4. The apparatus according to claim 3, wherein said control section changes the pressure of the fluid in accordance with progress of separation processing.

5. The apparatus according to claim 1, further comprising a driving mechanism for moving said ejection portion along the separation layer.

6. The apparatus according to claim 5, wherein when separating the peripheral portion of the disk-like member, said driving mechanism adjusts the position of said ejection portion such that the fluid is injected into the peripheral portion, and when separating a center of the disk-like member, said driving mechanism adjusts the position of said ejection portion such that the fluid is injected into the center.

7. The apparatus according to claim 1, wherein the separation layer is more fragile than remaining portions of the disk-like member.

8. The apparatus according to claim 1, wherein the separation layer is a porous layer.

9. The apparatus according to claim 1, wherein the separation layer is a porous layer having a multilayered structure.

10. A separating apparatus for separating a disk-like member having a separation layer inside comprising:
    a holding portion for holding the disk-like member while rotating the disk-like member; and
    a fluid ejection portion for injecting a stream of fluid to the separation layer of the disk-like member held by said holding portion to separate the disk-like member at the separation layer by the fluid,
    wherein to separate only a peripheral portion from the disk-like member, separation processing is executed under a condition in which an outermost peripheral portion of the disk-like member is separated from an inside to an outside of the disk-like member, except at the separation start position, by the fluid injected into the rotating disk-like member.

11. A separating method of rotating a disk-like member having a separation layer inside about an axis perpendicular to the separation layer and ejecting a stream of fluid from an ejection portion into the separation layer to separate the disk-like member at the separation layer by the fluid comprising:
    the peripheral portion separation step of separating only a peripheral portion from the disk-like member,
    wherein to separate only a peripheral portion from the disk-like member, a rotational direction of the disk-like member, a moving direction of the fluid, and a position of said ejection portion satisfy a condition,
    wherein the condition is expressed by $|v|\cos \theta < 0$ where (1) $\theta$ is the angle between the direction of the moving fluid and the direction of the velocity of the peripheral portion at the injection position and (2) $v$ is the velocity of the peripheral portion.

12. The method according to claim 11, wherein the peripheral portion separation step comprising ejecting, from said ejection portion, the fluid having pressure at which an outermost peripheral portion of the disk-like member is separated from an outside to an inside to an outside, except at the separation start position, by the fluid injected into the disk-like member.

13. The method according to claim 11, further comprising the control step of controlling the pressure of the fluid ejected from said ejection portion.

14. The method according to claim 11, wherein the separation layer is more fragile than remaining portions of the disk-like member.

15. The method according to claim 11, wherein the separation layer is a porous layer.

16. The method according to claim 11, wherein the separation layer is a porous layer having a multilayered structure.

17. A separating method of holding a disk-like member having a separation layer inside, ejecting a stream of fluid from an ejection portion, and injecting the fluid into the separation layer to separate the disk-like member at the separation layer by the fluid comprising:

the peripheral portion separation step of separating only a peripheral portion from the disk-like member, wherein to separate the peripheral portion from the disk-like member, the disk-like member is rotated under a condition in which an outermost peripheral portion of the disk-like member is separated from an inside to an outside of the disk-like member, except at the separation start position, by the fluid injected into the disk-like member.

* * * * *

UNITED STATES PATENT AND TRADEMARK OFFICE
CERTIFICATE OF CORRECTION

PATENT NO. : 6,609,446 B1
DATED : August 26, 2003
INVENTOR(S) : Kazuaki Ohmi et al.

It is certified that error appears in the above-identified patent and that said Letters Patent is hereby corrected as shown below:

<u>Column 4,</u>
Line 28, "bout" should read -- about --

Signed and Sealed this

Thirtieth Day of December, 2003

JAMES E. ROGAN
*Director of the United States Patent and Trademark Office*